United States Patent [19]
Hopfer et al.

[11] Patent Number: 5,761,036
[45] Date of Patent: Jun. 2, 1998

[54] SOCKET ASSEMBLY FOR ELECTRICAL COMPONENT

[75] Inventors: Albert N. Hopfer, Park Ridge; Edward M. Allard, Des Plaines, both of Ill.

[73] Assignee: Labinal Components and Systems, Inc., Lombard, Ill.

[21] Appl. No.: 467,727

[22] Filed: Jun. 6, 1995

Related U.S. Application Data

[63] Continuation of Ser. No. 923,849, Jul. 31, 1992, Pat. No. 5,485,351, which is a continuation-in-part of Ser. No. 871,586, Apr. 20, 1992, Pat. No. 5,282,111, which is a continuation of Ser. No. 499,025, Mar. 26, 1990, abandoned, which is a continuation-in-part of Ser. No. 364,343, Jun. 9, 1989, abandoned.

[51] Int. Cl.$^6$ .................................................. H65K 7/20
[52] U.S. Cl. .................... 361/704; 174/16.3; 439/485; 439/487; 361/707; 361/785
[58] Field of Search .................... 174/16.3; 165/80.2, 165/80.3, 185; 361/704–710, 715–719, 722, 728, 730, 735, 744, 760, 785–787, 807–810; 439/72, 73, 79, 331, 485, 487, 571, 676, 741

[56] References Cited

U.S. PATENT DOCUMENTS

| | | | |
|---|---|---|---|
| 2,153,177 | 4/1939 | Ecker | 175/298 |
| 2,853,656 | 9/1958 | Dowds | 317/101 |
| 3,077,511 | 2/1963 | Bohrer et al. | 174/68.5 |
| 3,195,628 | 7/1965 | McAdam | 165/185 |
| 3,200,297 | 8/1965 | Gibson | 317/101 |

(List continued on next page.)

FOREIGN PATENT DOCUMENTS

| | | |
|---|---|---|
| 0143262 | 6/1985 | European Pat. Off. . |
| 2189657 | 10/1987 | United Kingdom . |

OTHER PUBLICATIONS

ETI, Elastomeric Connector Catalog, copyright 1989, see p. 41.
Franck et al. "Microcircuit Module and Connector", IBM Tech. Disclosure Bulletin, vol. 13, No. 7, Dec. 1970 pp. 1786–1787.
IBM Technical Disclosure Bulletin, p. 58, vol. 13, No. 1, Jun. 1970, "Integrated Circuit Package and Heat Sink.".
Cho–Therm Thermal Interface Materials products catalog, pp. 1–3, 8–14, available to applicant in approximately May 1991.
SMART II Proceedings, Surface Mounting and Reflow Technology Conference, Jan. 1986, pp. 23–37.
EG&G Wakefield Engineering, heat dissipation components product catalog, pp. 1, 24–34, 94–97, 100–102, copyright 1988.
IBM Technical Disclosure Bulletin, vol. 22, No. 1, Jun. 1979, pp. 158–159.
Design News, Designer's Corner, Chip Socket by Rogers Corp., Tempe, AZ. ISO–CON connector, Apr. 8, 1991, p. 50 and undated article on same design.

*Primary Examiner*—Gregory D. Thompson
*Attorney, Agent, or Firm*—Leydig, Voit & Mayer, Ltd.

[57] ABSTRACT

A socket assembly for mechanically and electrically coupling an integrated component with an interfacing carrier comprises a socket body for receiving the integrated component, a retaining spring hingedly connected to the socket body for retaining the integrated component within the socket body, and at least one post element. The socket body includes at least one generally cylindrical receiving member having at least a portion protruding through an aperture in the interfacing carrier which is deformable to engage the socket body with the carrier when the post element is received within the receiving element. The socket body also includes a first mounting surface having plurality of holes for receiving wadded button contacts and a heat transfer element in contacting relation with the mounting side of the integrated component.

8 Claims, 3 Drawing Sheets

U.S. PATENT DOCUMENTS

| | | | |
|---|---|---|---|
| 3,419,844 | 12/1968 | Schmued | 339/48 |
| 3,509,206 | 4/1970 | Harshman et al. | 200/46 |
| 3,513,434 | 5/1970 | Zielke | 339/18 |
| 3,616,532 | 11/1971 | Beck | 29/625 |
| 3,680,037 | 7/1972 | Nellis et al. | 339/61 M |
| 3,764,959 | 10/1973 | Toma et al. | 339/177 R |
| 3,795,037 | 3/1974 | Luttmer | 29/628 |
| 3,795,047 | 3/1974 | Abolafia et al. | 29/625 |
| 3,858,958 | 1/1975 | Davies | 339/17 LM |
| 3,862,790 | 1/1975 | Davies et al. | 339/17 LM |
| 3,873,173 | 3/1975 | Anhalt | 339/17 CF |
| 3,881,799 | 5/1975 | Elliott et al. | 339/252 R |
| 3,904,934 | 9/1975 | Martin | 317/101 D |
| 3,917,375 | 11/1975 | Johnson | 339/112 R |
| 3,971,610 | 7/1976 | Buchoff et al. | 339/17 R |
| 4,029,375 | 6/1977 | Gabrielian | 339/17 M |
| 4,082,399 | 4/1978 | Barkhuff | 339/75 M |
| 4,082,407 | 4/1978 | Smorzaniuk et al. | 339/112 R |
| 4,092,697 | 5/1978 | Spaight | 361/386 |
| 4,168,877 | 9/1979 | Little et al. | 339/103 M |
| 4,190,098 | 2/1980 | Hanlon | 165/1 |
| 4,193,108 | 3/1980 | Romano | 361/399 |
| 4,202,593 | 5/1980 | Abernethy et al. | 339/125 R |
| 4,236,776 | 12/1980 | Wellington | 339/17 R |
| 4,257,661 | 3/1981 | Dalamangas et al. | 339/75 MP |
| 4,278,311 | 7/1981 | Scheingold et al. | 339/17 CF |
| 4,360,858 | 11/1982 | Fahling | 361/380 |
| 4,373,778 | 2/1983 | Adham | 350/96.2 |
| 4,508,405 | 4/1985 | Damon | 339/75 MP |
| 4,539,621 | 9/1985 | Currier | 361/386 |
| 4,574,331 | 3/1986 | Smolley | 361/393 |
| 4,581,679 | 4/1986 | Smolley | 361/395 |
| 4,593,961 | 6/1986 | Cosmo | 339/61 M |
| 4,595,794 | 6/1986 | Wasserman | 174/138 |
| 4,620,761 | 11/1986 | Smith et al. | 339/75 MP |
| 4,679,118 | 7/1987 | Johnson et al. | 361/386 |
| 4,682,269 | 7/1987 | Pitasi | 361/386 |
| 4,706,161 | 11/1987 | Buckingham | 361/220 |
| 4,707,657 | 11/1987 | Boegh-Petersen | 324/158 F |
| 4,716,494 | 12/1987 | Bright et al. | 361/386 |
| 4,731,698 | 3/1988 | Millot et al. | 361/386 |
| 4,733,172 | 3/1988 | Smolley | 324/158 P |
| 4,744,009 | 5/1988 | Grabbe et al. | 361/398 |
| 4,750,092 | 6/1988 | Werther | 361/400 |
| 4,803,546 | 2/1989 | Sugimoto et al. | 357/81 |
| 4,988,306 | 1/1991 | Hopfer et al. | 439/66 |
| 4,992,053 | 2/1991 | Lindeman et al. | 439/66 |
| 5,000,689 | 3/1991 | Ishizuka et al. | 439/73 |
| 5,007,841 | 4/1991 | Smolley | 439/66 |
| 5,013,249 | 5/1991 | Lindeman | 439/66 |
| 5,074,798 | 12/1991 | Carter | 439/72 |
| 5,109,980 | 5/1992 | Matsuoka et al. | 206/328 |
| 5,127,837 | 7/1992 | Shah et al. | 439/71 |
| 5,163,837 | 11/1992 | Rowlette | 439/91 |
| 5,282,111 | 1/1994 | Hopfer | 361/704 |

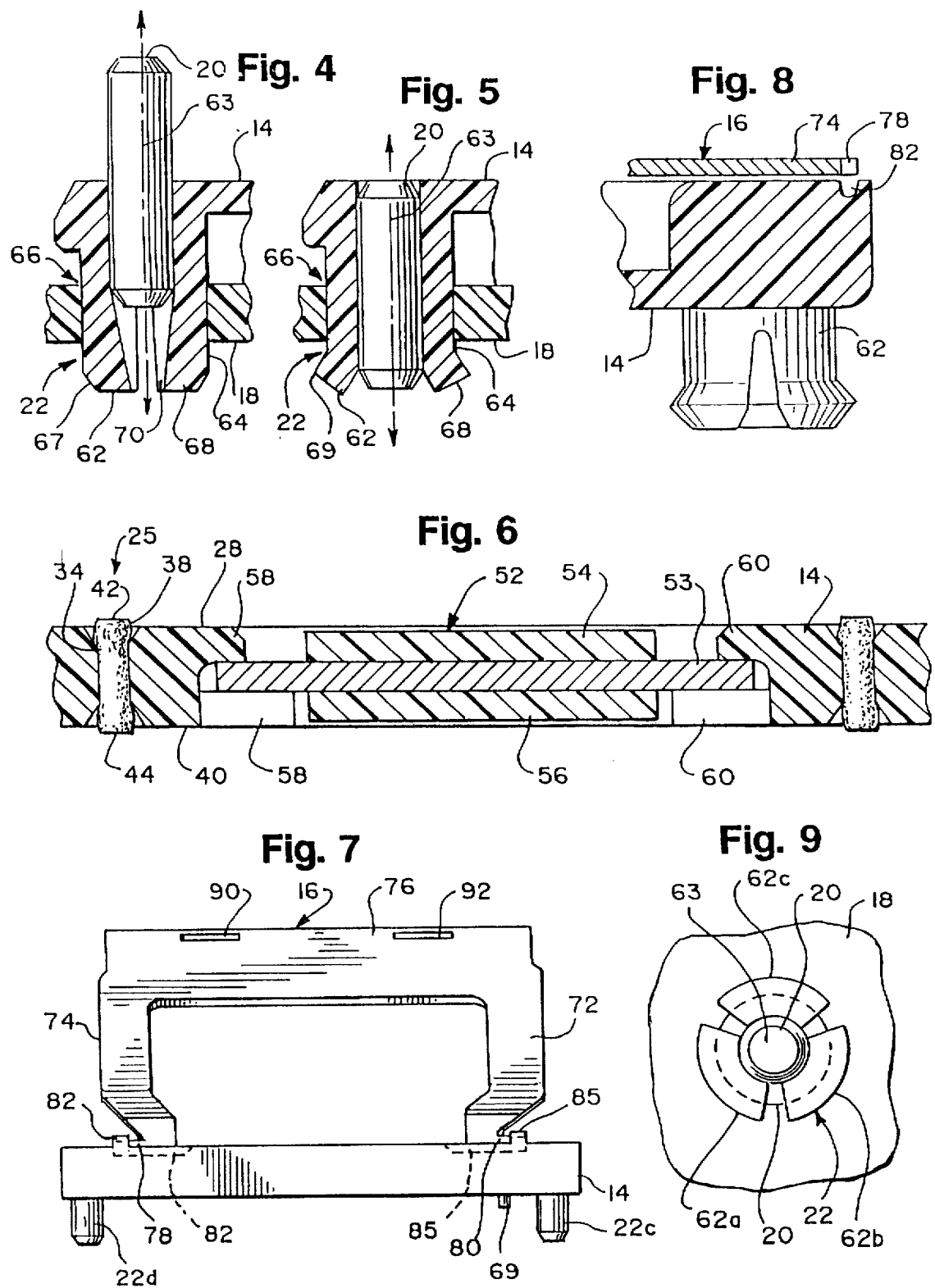

SOCKET ASSEMBLY FOR ELECTRICAL COMPONENT

CROSS REFERENCE TO RELATED APPLICATIONS

This is a continuation of application Ser. No. 07/923,849, filed on Jul. 31, 1992, now U.S. Pat. No. 5,485,351, which is a continuation-in-part of copending application Ser. No. 07/871,586, filed Apr. 20, 1992, by Albert N. Hopfer, now U.S. Pat No. 5,282,111 which is a continuation of application Ser. No. 499,025, filed Mar. 26, 1990, now abandoned, which is a continuation-in-part of application Ser. No. 07/364,343, filed Jun. 9, 1989, now abandoned, by Arun J. Shah, David W. McClung, Albert N. Hopfer, Richard J. Lindeman, and Saeed Zafer, which was continued in application Ser. No. 07/754,261, now U.S. Pat. No. 5,127,837, each of said applications being incorporated herein by reference.

FIELD OF THE INVENTION

This invention relates to the integrated electrical component art, and more particularly, to a socket assembly which provides mechanical and solderless electrical interconnection with an integrated electronic circuit package. The socket assembly utilizes a press mount-type post arrangement which engages a socket body with an electrical interface carrier.

BACKGROUND OF THE INVENTION

Integrated circuit ("IC") chips contain a variety of miniaturized electronic circuitry and are widely used in conjunction with printed circuit ("PC") boards to provide composite electrical circuits. A typical IC chip or die is located within a ceramic substrate and has a plurality of circuit inputs and outputs that are coupled to electrically conductive contacts or terminals positioned about the perimeter of the substrate or in various patterns across the bottom surface of the substrate such as in land grid arrays ("LGAs"). This assembly is referred to as an IC package or a chip carrier. During operation, the die generates heat which, if unaccounted for, tends to degrade or even destroy active circuit elements in the die. In addition, such heat severely limits the speed and power capabilities of the integrated circuitry.

Heretofore, IC packages have typically been coupled to a mounting side of the PC board by soldering the electrical contacts of the IC package directly to the PC board. Of course, it is somewhat difficult to replace a faulty IC package with this type of connection inasmuch as each of the electrical contacts of the IC package must be desoldered from the circuit board. Alternatively, IC packages have been mounted into sockets or socket cavities particularly sized and shaped for receipt of the IC package. The socket is thereafter coupled to the mounting side of the PC board at a preselected position designated for the IC package. The use of IC sockets in this manner eases installation and replacement of the IC package since a faulty IC package can be replaced without the need for desoldering the faulty IC package and then resoldering the operable IC package at the appropriate location.

Likewise, the use of wadded conductor contacts or "buttons" mounted in insular substrates to form "button boards" is a known type of interface for electronic circuit coupling. They typically provide both direct coupling and physical separation between electronic circuits, which are commonly formed on adjacent circuit boards. Most frequently, these buttons are retentively engaged in corresponding holes in or passing through the nonconducting substrate carrier board. The ends of these buttons are exposed and typically protrude at the respective surface of the insulative carrier board. Such conductive buttons have low resistance when their exposed ends are compressively engaged with surface contact pad areas on the circuit boards.

However, conventional IC socket designs have required an inordinate amount of time in securing the IC package to its complemental socket, and in turn, securing the socket to the PC board. Conventional IC socket designs have typically comprised a plurality of holes located about the periphery of the socket, each of which must be aligned with respective holes in the circuit board and/or any interfacing board. Each of a plurality of bolts are thereafter separately placed within the holes and secured with complemental washers and nuts for fastening the IC socket assembly to the PC board. In addition, these socket designs required a separate retaining spring to be attached to the socket body after the insertion of the IC chip package. These retaining springs required the use of special tools and the springs were attached during the assembly of the PC board. Thus, in order to effect attachment of these socket assemblies to the circuit board, skilled personnel are required to align and manipulate a large number of parts using various tools.

With these arrangements, a back-up board or back-up plate is commonly utilized to provide sufficient strain relief for securing the IC socket to the PC board. The back-up plate is positioned on a side of the PC board opposite the mounting side and the IC socket. Thus, such IC socket arrangements additionally provide an undesirably high profile. This is particularly problematic in designs where efficient use of circuit real estate is important.

Likewise, conventional IC socket designs now offer unacceptable thermal transfer characteristics. For example, one known arrangement for dissipating heat generated by the IC package is the use of a heat sink attached to the top of the IC package. Such arrangements are shown in Spaight U.S. Pat. No. 4,092,697, Sugimoto et al. U.S. Pat. No. 4,803,546, and Werther U.S. Pat. No. 4,750,092. In other arrangements, thermal conducting elements are used to transmit heat to a heat sink which is mounted on the PC board opposite the IC package, as shown, for example in Pitsai U.S. Pat. No. 4,682,269 and IBM Technical Disclosure Bulletin Vol. 13 No. 1, June 1970 at page 58. In yet another example of an arrangement which provides heat dissipation, Bright et al. U.S. Pat. No. 4,716,494 discloses a removable heat sink attached to the upper surface of an IC package. The use of such a heat sink attached to the IC package raises the profile of the overall structure and thus, diminishes the availability of space.

While these structures satisfactorily provide thermal transfer for IC packages which direct thermal flow upward, they are not suitable for use with IC packages which direct thermal flow downward, i.e., toward the PC board or into the socket. In such IC packages, the thermal transfer area and electrical contacts are located on the same surface. These IC packages use a "cavity up" configuration and incorporate a metal slug disposed in a cavity formed in the IC package to dissipate heat from the die. However, in the cavity up configuration, the metal slug is attached to the lower portion of the IC package, i.e., the mounting side of the IC package away from the thermal transfer element. The metal slug conducts heat generated by the die which thereafter must be appropriately dissipated.

SUMMARY OF THE INVENTION

Thus, the prior art IC socket designs now offer unsatisfactory performance, at high cost with considerable effort owing to aligning and placement of the IC package within the socket, and in turn, to securing the socket at an appropriate location on the PC board. Likewise, they provide unacceptable and avoidable thermal retention. Accordingly, it is generally an object of the present invention to overcome the deficiencies of the prior art.

More specifically, it is an object of the present invention to provide a commercial quality socket assembly that increases efficiency in securing the socket assembly to a PC board.

It is an additional object of the present invention to provide improved thermal conduction for adequately addressing thermal transfer needs of an IC package.

It is yet a further object of the present invention to provide a socket assembly having a low height profile and a small interconnect profile without the need for a back-up board or back-up plate.

It is another object of the present invention to provide a socket assembly which has all of the components attached to the socket assembly and eliminates the need for separate components. Thus, the final assembly of the socket to the PC board only requires placement of the socket assembly onto the PC board, pressing the posts, inserting the IC chip package and securing the retaining spring over the IC package.

The present invention provides these and other additional objects through an improved socket assembly for coupling an integrated circuit ("IC") chip package to a carrier, such as a printed circuit ("PC") board. Structurally, the socket assembly of this invention includes a socket body having a plurality of holes arranged on a mounting side of the socket body in a predetermined pattern for aligning with one or more electrical contacts of the IC chip package. Each of the holes contains a wadded conductor or "button", with or without additional elements, forming a connector for providing a solderless electrical interconnection by coupling respective electrical contacts of the IC package with carrier traces. In addition, the socket body mounting side comprises a aperture for receiving a thermal transfer member for contacting the mounting side of the IC chip package in thermal transfer relation when the IC chip package is disposed within the socket body. The IC package is retentively engaged within the socket body with a retention spring hingedly connected to the socket body.

A plurality of press-type post elements mechanically couple and secure the socket body to the PC board. Each of the post elements are adapted for axial insertion within respective elongate receiving members extending from the socket body. The receiving members have an outer configuration sized and shaped for placement within holes of the PC board with at least a portion of the receiving members protruding through the circuit board. The receiving members have a generally cylindrical inner configuration which is tapered along at least a portion thereof such that the receiving members are inelastically radially deformable to engage the PC board and retentively secure the socket assembly when the post elements are axially inserted therein.

Thus, all of the components are joined to the socket assembly and separate components, such as bolts, nuts and retaining springs are not necessary.

BRIEF DESCRIPTION OF THE DRAWINGS

FIG. 4 is a cross sectional view along the lines 4—4 of FIG. 2 showing a post element and complemental receiving member configuration of the socket assembly when the post element is partially axially inserted into the complemental receiving member.

FIG. 5 is another cross sectional view of the post element and complemental receiving member shown in FIG. 4 illustrating the deformation of the receiving member after full insertion of the post element into the receiving member.

FIG. 6 is still another cross sectional view of the socket assembly of FIG. 2 taken along the lines 6—6.

FIG. 7 is a side elevational view of the socket assembly of the present invention illustrating the hinged connection of the retaining spring to the socket body.

FIG. 8 is a cross sectional view of the IC package and socket assembly of FIG. 2 taken along the lines 8—8 illustrating a post arrangement and connection of the retaining spring.

FIG. 9 is a bottom fragmentary view of the receiving member shown in FIG. 5 illustrating deformation thereof when the receiving member is inserted within an aperture formed in the PC board and the post element is fully inserted within the receiving member.

DESCRIPTION OF THE PREFERRED EMBODIMENT

Generally, the present invention relates to a socket assembly which provides electrical and mechanical connection of an integrated circuit ("IC") package to a printed circuit ("PC") board or other electrical interface carrier. The socket assembly provides high speed electronic interconnection for electrical contacts of the IC package with the use of button contacts arranged in a socket body. The socket assembly further provides a novel mechanical connection to the PC board with a press-mount arrangement for securing the assembled IC package and socket to the circuit board. In addition, the socket assembly of a preferred embodiment provides thermal transfer from the IC package to the PC board for efficient operation of the electrical circuitry contained therein.

Figure 1:
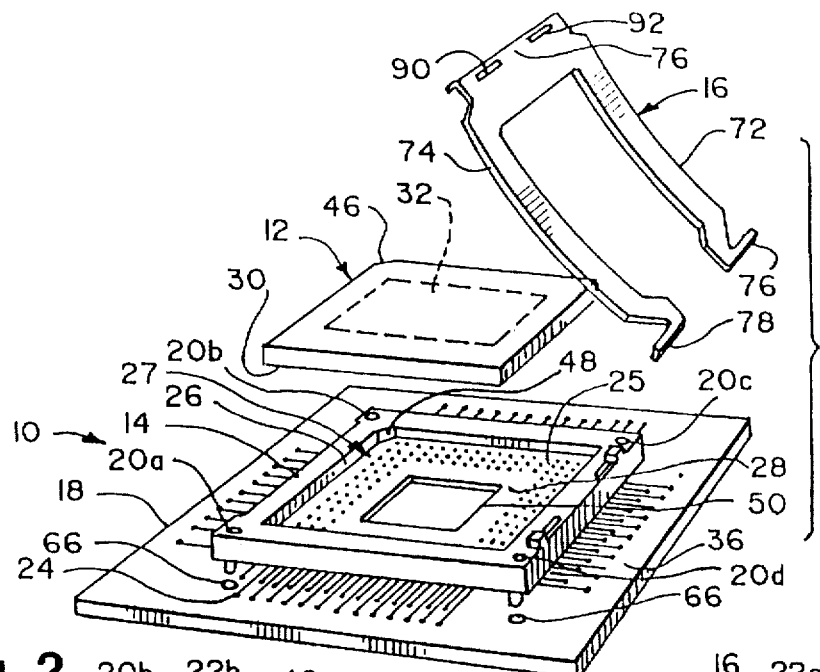
FIG. 1 is an exploded perspective view of the integrated circuit package and socket assembly according to the present invention used in conjunction with a circuit board.

Turning now to the drawings and in particular to FIG. 1, therein is shown an exploded perspective view of a socket assembly 10 according to the present invention. The socket assembly 10 is suitable for providing a mechanical and electrical connection for an integrated electronic circuit ("IC") package 12 when the IC package is placed within a socket body 14. The IC package 12 is retentively engaged within the socket body 14 with the use of a retention spring 16. The socket body 14, in turn, is mechanically coupled to a printed circuit board 18 or other electrical interfacing carrier with the novel use of one or more press-fit post elements 20a–d, each of which is axially inserted within, and in radial compressive engagement with, complemental receiving expandable members 22a–d extending from the socket body 14 (see FIGS. 2 and 3), to thereby radially expand the receiving members 22a–d for securing the socket assembly 10 to the PC board 18, as described in greater detail below. The IC package 12 is electrically coupled to a plurality of electrically conductive traces 24 formed on the PC board 18 with the use of a plurality of contacts 25 disposed in the holes formed in the socket body 14.

In the preferred embodiment, the socket body 14, including receiving members 22a–d, is a molded plastic material one-piece construction, preferably fabricated of polyphenylene sulfide. The socket body 14 includes four inner sidewalls 26 which form a socket receiving cavity 27 sized for receipt of the IC package 12. Included within the socket body 14 is a first surface 28 that abuts a mounting side 30 of the IC package when the IC package is placed within the socket body 14.

The IC package 12, which is sometimes referred to by those skilled in the art as an IC chip package or chip carrier, contains a die (denoted by a dashed line 32) concealed within the IC package 12 which typically contains thousands of miniature electrical elements arranged in circuit. A plurality of circuit input/output leads contained in the IC package 12 are connected to electrical contacts (not shown) disposed on the mounting side 30 of the IC package 12, as will be understood by those skilled in the art. Such electrical contacts are normally disposed in a predetermined pattern or array, which is known as a land grid array ("LGA"), about the outer periphery of the mounting side 30 of the IC package 12.

Figure 2:
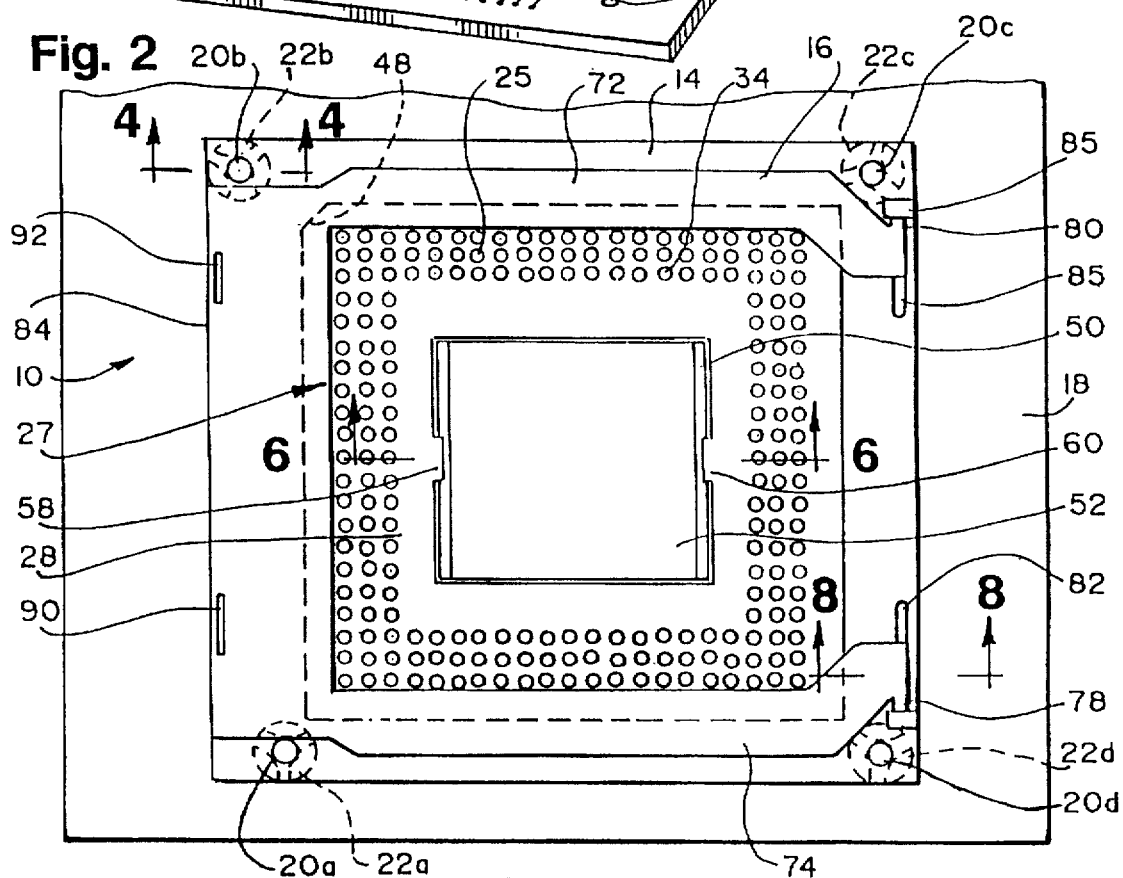
FIG. 2 is a top plan view of the socket assembly of FIG. 1 with the IC package removed for clarity.

Turning now jointly to FIG. 2 and also to FIG. 6, therein is shown the socket body 14 with at least one hole 34 therethrough. The socket body 14 typically contains a plurality of spaced holes 34 arranged in an array, such as a grid pattern, chosen to correspond to the locations of circuit interconnection between associated electronic circuit contacts with which the assembly is to be used. Accordingly, the spaced holes 34 correspond to the electrical contact pattern on the lower mounting side 30 of the IC package 12. Likewise, the spaced holes 34 correspond to the electrical contact pattern on an upper mounting side 36 of the PC board 18.

Figure 10:
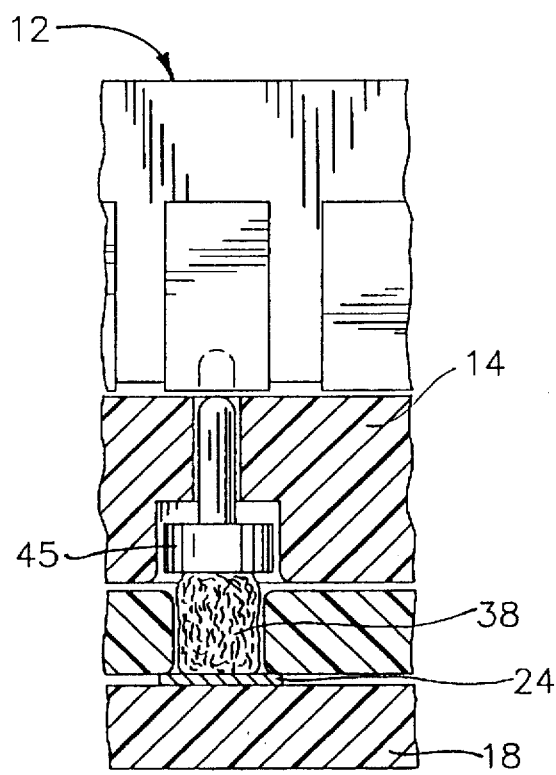
FIG. 10 is a fragmentary sectional view of a second embodiment of the contact and socket assembly.
Figure 11:
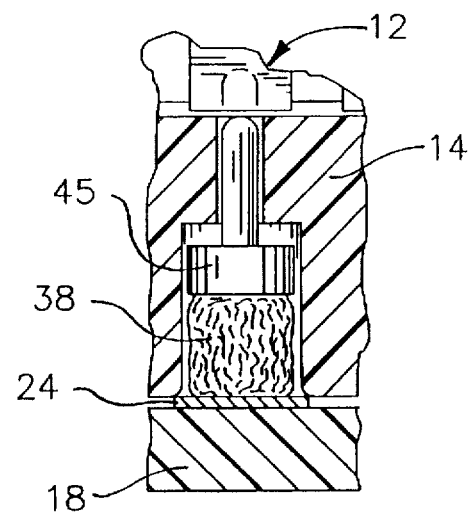
FIG. 11 is a fragmentary sectional view of a third embodiment of the contact and socket assembly.
Figure 12:
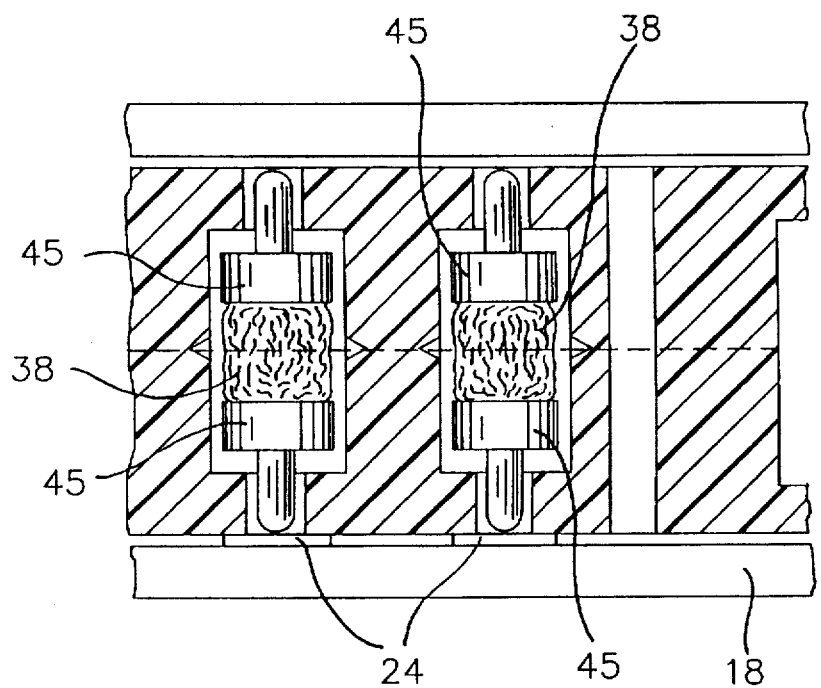
FIG. 12 is a fragmentary sectional view of a fourth embodiment of the contacts and socket assembly.

The hole 34 at each location where an electrical interconnection is desired contains a resilient electrical contact 25 (see FIG. 6). In the preferred embodiment, each of the electrical contacts 25 comprises a resiliently wadded conductor 38, typically in the form of an elongated, substantially cylindrical contact element comprising a resiliently and randomly wadded single thin gauge electrically conductive wire. By way of example, the contacts 38 may be of the type commercially marketed by Labinal Components and Systems, Inc. of Elk Grove Village, Ill. under the designation "CIN::APSE." The contacts 38 extend generally from at least the first surface 28 of the socket body 14 to a second surface 40 of the socket body 14, and protrude slightly beyond the first and second surfaces 28 and 40. The respective ends 42 and 44 of each of the contacts are exposed at the first and second surfaces 28 and 40, respectively, and each comprises a button contact 38. The electrical contacts 25 can include additional elements, such as plungers 45, as shown in FIGS. 10–12 which are repeated from U.S. Pat. No. 5,127,837. In another embodiment, the contacts 38 are electrically conductive elastomeric connectors.

It will be noted from FIG. 6 that at the first and second surfaces 28 and 40, the button-receiving holes 34 are preferably chamfered or enlarged. Such enlargement not only facilitates entry of a button if inserted from such surface but provides space assuring retention of each button within the limits of the board opening despite any button "mushrooming" off-center shifting of the button ends during compression or presence of loosened strands at the button ends.

Turning back to FIG. 1 and FIG. 2, the IC package 12 is properly aligned within the socket body 14 with the use of an indentation 46 formed in the side walls 26 of the IC package 12 and complemental protrusion 48 formed in the side walls of the socket body 14 for properly registering the IC package 12 within the socket cavity 27. Of course, the registering function of the indentation 46 could be achieved in varying configurations, with the number, location and size of the indentations depending on the particular application.

FIG. 1 and FIG. 2 further illustrate a generally rectangular aperture 50 formed in the first surface 34 of the socket body 14. In the preferred embodiment, the aperture 50 is spaced inward from the hole grid pattern 34. As shown in FIG. 2, a thermal transfer pad assembly 52 is seated within the socket body aperture 50 for conducting heat from the mounting side of the IC package 12 when the IC package is placed within the socket receiving cavity 27. Such heat dissipating means is particularly well suited for IC packages which use a "cavity up" configuration wherein thermal flow is directed toward the bottom or mounting side 30 of the IC package, i.e., directed toward the PC board 18. As best seen in FIG. 6, the thermal transfer pad assembly 52 preferably comprises a steel carrier plate 53 sandwiched between first and second thermally conductive coatings 54 and 56 of substantially equal thickness. The coatings 54 and 56 comprise a pliable thermal interface material with good thermal conductivity, such as a thermal transfer pad or film marketed by Chromerics, Inc. of Hudson, N.H., under the trade name CHO-THERM. The use of the thermal interface material insures intimate thermally conducting contact between the IC package mounting side 30 and the thermal transfer pad 52, and, in turn, between the thermal transfer pad 52 and the circuit board 18.

The thermal transfer pad assembly 52 is engaged within the aperture 50 with the use of a pair of upper and lower opposed tabs 58 and 60 formed in the socket body 14. In particular, the steel carrier plate 53 is interfit between opposed the pairs of tabs 58 and 60 formed in the socket body 14 to retentively engage the thermal transfer pad assembly 52. Of course, the thermal transfer pad assembly 52 could be seated within the aperture 50 with other suitable engagement means as will occur to those skilled in the art.

Turning now jointly to FIGS. 2 as well as FIGS. 4 and 5, therein is shown the press-type mounting arrangement according to the present invention for efficiently mounting the socket assembly 10 to the PC board 18 or other electrical interfacing carrier. The use of the mounting arrangement of the present invention provides a simple and inexpensive attachment for the socket body 14 to the PC board, while at the same time, the mounting arrangement obviates the need for multiple attaching means such as the use of a bolt, nuts and washer to effect such a mechanical connection as was heretofore known. In addition, the mounting arrangement of the present invention provides adequate retention of the socket assembly to firmly secure the same to the circuit board.

As noted above, the socket body 14 includes one or more expandable receiving members 22 which receive and retentively grip respective press-type actuator post elements 20. As best seen in FIGS. 4, 5, and also FIG. 9, each of the receiving members sleeves 22 comprises a plurality of spaced fingers 62a–c which are radially expandable along at least a portion thereof and are arranged in a generally symmetrical configuration about an axis 63. Preferably, each receiving member 22 includes three such fingers 62a–c.

Complementary engagement surfaces provide a radial cam action to expand each member into fixed engagement with the board, preferably including substantial enlargement of the distal portion beneath the board 18. This is preferably by a simple cylindrical pin cooperating with downwardly convergent cam surfaces on the inner surface of the sleeve fingers 62 as shown.

As seen in FIG. 4, prior to deformation of the fingers 62a–c, the outer surfaces 64 of each array of fingers 62 provide an outer cross-sectional dimension corresponding to or slightly less than that of the PC board aperture 66. In this way, the receiving member 22 may be placed or lightly press-fit within an aperture 66 formed in the PC board 18 prior to deformation of the fingers 62a–c. The distal ends of the fingers 62 have a chamfer 67 to facilitate insertion of the fingers 62 into the aperture 66. One or more alignment pins 69 engage openings in the PC board 18 to establish the proper orientation of the socket body 14 to the PC board 18.

Each of the receiving member fingers 62 preferably includes a distal portion 68 which is tapered to expand outwardly or otherwise deformable when the post element 20 is fully inserted in the receiving member 22. The distal portion 68 protrudes through the PC board 18 opposite the socket body 14 when the receiving member is seated within the PC board aperture 66. As shown in FIG. 4, each of the fingers 58 includes a distal portion 68 with an inner surface 70 which is tapered radially inwardly. As shown in FIG. 5, when the post element 20 is fully axially inserted within the complementary receiving member 22, each of the finger deformable portions 68 is urged radially outwardly such that it engages the inner surface of the PC board 18 defining aperture 66. Likewise, the distal portions 68 of fingers 62a–c expand radially outwardly and achieve a transverse dimension greater than that of the PC board aperture 66. In this regard, the distal portions 68 expand outwardly to form a collar 69 (FIG. 5) to prevent removal of the socket assembly 14. In this way, the receiving member 22 retentively engages the socket assembly 14 to the PC board 18.

Figure 3:
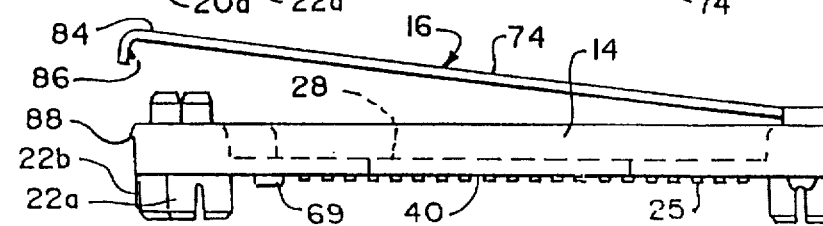
FIG. 3 is a side elevation view of the socket assembly of the present invention illustrating a retaining spring in a released position.

FIGS. 2-3 and also FIGS. 7-8 show details of the retention spring 16 used to engage the IC package 12 within the socket body 14. The retention spring 16 is generally U-shaped and preferably fabricated from steel. The retention spring 16 comprises first and second leg portions 72, 74 which are joined at one end with a connecting bight region 76. The opposite ends of the leg portions 72 and 74 terminate with pivot projections 78 and 80 that extend generally outwardly in opposed directions. The projections 78 and 80 fit within a pair of clip receiving hinge sockets 82 and 84 formed in the socket body 14 to form a pivot hinge connection between the spring 16 and the body 14. In order to engage the projections 78 and 80 within their respective clip receiving sockets, a force is applied to compress the leg portions 72 and 74 inwardly such that the projections 78 and 80 are positioned between receiving sockets 82 and 84 formed in the socket body 14. When the force is removed from the leg portions, they spread outward to engage the projections 78 and 80 in the receiving sockets 82 and 84. In this way, the retention spring is hingedly connected to the socket body 14.

The connecting region 76 of the retention spring 16 includes a pair of protuberances (one of which is shown as numeral 86 in FIG. 3) formed in the connecting region 76. The protuberances 86 interlock with complemental notch portions 88 formed on the periphery of the socket body 14 (see FIG. 3). In addition, the retention spring 16 preferably includes one or more apertures 90 and 92 formed in the connecting region 76 for permitting a suitable tool for releasing the retention spring 16 from its interlocked position.

In order to engage the IC package 12 within the socket body 14, the IC package 12 is initially centered within the socket body cavity. The overlying retention spring 16 is thereafter interlocked with peripheral portions of the socket body 14, as described above. The retention spring 16 urges the IC package 12 downwardly with a desired, predetermined biasing force against the distal terminal portions of the resilient contacts 25. Electrical communication is thus established between the respective electrical contacts of the IC package 12 with the use of interconnecting resiliently compressible contacts 38 mounted in the circuit board 18.

Use of conductive contacts 38 for the purposes of effecting electrical connections is known in the art. Each wadded wire contact 38 is formed to fit within its receiving opening in circuit board 18 as illustrated in FIG. 6 so as to be frictionally gripped thereby in the central area for retention of the button contact in the board but so as to not restrict the ability of at least its end portions to function as a resilient spring member. As noted earlier, the electrical contact 25 can include additional elements, such as plungers 45, as shown in FIGS. 10–12 which are repeated from U.S. Pat. No. 5,127,837.

Likewise, placement of respective receiving members 22 of the socket assembly 10 within corresponding circuit board apertures 66 and thereafter inserting the post elements 20 to engage the socket assembly with the circuit board 18 establishes electrical communication between the contacts 25 and respective traces 24 on the circuit board.

Various advantages flow readily from the disclosed socket assembly. For example, a dramatic decrease in time for installation of the socket assembly is required to provide better electrical and mechanical connection for the same IC package. That is, where a previous socket assembly may employ the use of bolts, nuts, and washers to effect coupling of a socket to a circuit board, the present invention can provide that same connection, while eliminating alignment and intermediate installation steps. In addition, all components are joined to the socket assembly including the retaining spring. Consequently, there are no separate components to be assembled when the socket assembly is attached to the PC board. Thus, the final assembly of the socket assembly to the PC board only requires positioning of the socket assembly onto the PC board, pressing the posts, inserting the IC package and rotating the retaining spring downward to secure the IC package. Furthermore, the present invention provides increased thermal conduction from the IC package for increased longevity and performance thereof.

Accordingly, a socket assembly meeting the aforestated objectives has been described. The socket assembly provides an efficient mounting of an integrated circuit package with the use of a press-fit mounting post arrangement. While specific embodiments of the invention have been illustrated and described, it will be understood that the invention is not limited thereto since modifications would be apparent to one of ordinary skill in the art and familiar with the teaching of this application, and thus, are deemed to be within the scope of this invention. Accordingly, the precise scope of the invention is set forth in the appended claims, which are made, by reference, a part of this disclosure.

What is claimed is:

1. A socket assembly coupling an electrical component with a circuit board having an aperture formed therein, said socket assembly comprising:

a socket body including a post receiving member having a first outer configuration sized for placement within the circuit board aperture which is expandable to a second outer configuration larger than the circuit board aperture;

a post element for axial insertion with said post receiving member to urge said post receiving member from said first outer configuration to said second outer configuration, a heat transfer aperture in said socket body, and a heat transfer means disposed in said heat transfer aperture, said heat transfer means including a thermally conductive rigid member, a first thermal transfer pad disposed on one side of said rigid member for contacting engagement with the electrical component and a second thermal transfer pad disposed on the other side of said rigid member for contacting engagement with the circuit board.

2. The invention as in claim 1 wherein said rigid member is attached to said socket body.

3. The invention as in claim 1 wherein said rigid member is made of metal.

4. A method for coupling a socket assembly with a substrate including the steps of:

provoding a substrate with an aperture formed therein, providing a socket assembly including a socket body, a post element, and post receiving member having a first outer configuration sized for placement within the substrate aperture which is expandable to a second outer configuration larger than said substrate aperture, positioning said post receiving member in said substrate aperture, inserting said post element within said post receiving member to urge said post receiving member from said first outer configuration to said second outer configuration, and providing a heat transfer aperture in said socket body and a heat transfer means disposed in said heat transfer aperture to allow for heat to transfer from said electrical component to said substrate, wherein said heat transfer means includes a thermally conductive rigid member, a first thermal transfer pad disposed on one side of said rigid member in contacting relation with the electrical component, and a second thermal transfer pad disposed on the other side of said rigid member in contacting relation with the circuit board.

5. A socket assembly coupling an electrical component with a substrate, said socket assembly comprising:

a socket body having a heat transfer means disposed in said socket body, said heat transfer means includes a thermally conductive rigid member, a first thermal transfer pad disposed on one side of said rigid member for contacting engagement with the electrical component and a second thermal transfer pad disposed on the other side of said rigid member for contacting engagement with the substrate.

6. The invention as in claim 5 wherein said rigid member is attached to said socket body.

7. The invention as in claim 6 wherein the rigid member is made of metal.

8. The invention as in claim 5 wherein said transfer pad is a pliable material.

* * * * *